United States Patent [19]

Sakamoto

[11] Patent Number: 5,276,403
[45] Date of Patent: Jan. 4, 1994

[54] NONLINEAR PREEMPHASIS-DEEMPHASIS SYSTEM

[75] Inventor: Etsurou Sakamoto, Kanagawa, Japan
[73] Assignee: Sony Corporation, Tokyo, Japan
[21] Appl. No.: 723,598
[22] Filed: Jul. 1, 1991
[30] Foreign Application Priority Data
  Jul. 9, 1990 [JP] Japan .................. 2-179695
[51] Int. Cl.$^5$ ............................. H04B 1/10
[52] U.S. Cl. ................... 328/167; 358/166; 358/36; 307/264
[58] Field of Search ........... 307/543, 556, 522, 523, 307/529, 264; 328/167, 169; 358/166, 36

[56] References Cited

U.S. PATENT DOCUMENTS

| | | | |
|---|---|---|---|
| 3,558,927 | 1/1971 | Humberstone | 307/264 |
| 3,875,584 | 4/1975 | Fletcher et al. | 358/36 |
| 4,224,581 | 9/1980 | Watanabe et al. | 328/169 |
| 4,400,721 | 8/1983 | Macovski | 358/37 |
| 4,451,746 | 5/1984 | Hirose et al. | 307/494 |
| 4,463,375 | 7/1984 | Macovski | 358/111 |
| 4,575,760 | 3/1986 | Nakagaki et al. | 358/167 |
| 4,587,576 | 5/1986 | Hirota et al. | 358/166 |
| 4,626,927 | 12/1986 | Hirota et al. | 358/310 |
| 4,635,120 | 1/1987 | Ichinoi | 358/167 |
| 4,646,153 | 2/1987 | Fukuda et al. | 358/167 |
| 4,703,343 | 10/1987 | Honjo | 358/36 |
| 4,748,498 | 5/1988 | Yamanishi et al. | 358/36 |
| 4,812,773 | 3/1989 | Yamamoto et al. | 328/167 |
| 4,827,342 | 5/1989 | Ohta et al. | 358/167 |
| 4,831,435 | 5/1989 | Song et al. | 358/140 |
| 4,849,826 | 7/1989 | Ohta | 358/336 |
| 4,860,105 | 8/1989 | Sakaguchi | 358/167 |
| 4,864,404 | 9/1989 | Matsuo | 358/167 |
| 4,885,639 | 12/1989 | Nakata et al. | 358/167 |
| 4,931,743 | 6/1990 | Fukuda et al. | 328/167 |
| 4,961,113 | 10/1990 | Okada et al. | 358/167 |
| 4,962,434 | 10/1990 | Matsuo | 358/340 |
| 5,005,081 | 4/1991 | Asano | 358/167 |

FOREIGN PATENT DOCUMENTS

| | | |
|---|---|---|
| 3206047 | 11/1982 | Fed. Rep. of Germany . |
| 61-285872 | 12/1986 | Japan . |
| 63-67975 | 3/1988 | Japan . |
| 63-268376 | 7/1988 | Japan . |
| 63-260276 | 10/1988 | Japan . |

OTHER PUBLICATIONS

Bénéteau "The Design of High-Stability DC Amplifiers", Application Data Fairchild Silicon Transistors, App-23, May 8, 1961 pp. 1-7.
Patent Abstracts of Japan, vol. 1, No. 162 (E-077) Dec. 21, 1977 and JP-A-52 108 711 (Nippon Hoso Kyokai).
Patent Abstracts of Japan vol. 2, No. 40 (E-022) Mar. 16, 1978 and JP-A-53 005 909 (Sony).

Primary Examiner—John S. Heyman
Assistant Examiner—Shawn Riley
Attorney, Agent, or Firm—William S. Frommer; Alvin Sinderbrand

[57] ABSTRACT

A nonlinear preemphasis-deemphasis system of simplified circuit configuration formed of nonlinear preemphasis and deemphasis circuits. The preemphasis circuit comprises a nonlinear signal increase circuit for increasing the amplitude of an input signal component whose frequency is higher than a predetermined frequency in accordance with the frequency of that signal component, until the signal component reaches a predetermined threshold level. The output of the signal increase circuit is added to the input signal, and the summed signal is supplied to a nonlinear signal decrease circuit having an operating characteristic inverse to that of the nonlinear signal increase circuit. Another adder adds the output of the signal decrease circuit to the input signal. The nonlinear deemphasis circuit is connected to the nonlinear preemphasis circuit via a signal transfer device and comprises a second nonlinear signal decrease circuit having an operating characteristic inverse to that of the nonlinear signal increase circuit for decreasing the amplitude of a received signal component whose frequency is higher than the predetermined frequency, the amplitude decrease being a function of the frequency of the received signal component, until the received signal component reaches a predetermined threshold level. A subtracter subtracts the output of the signal decrease circuit from the received signal.

6 Claims, 5 Drawing Sheets

1 : Signal Transmitter
2 : Signal Transferer
3 : Signal Receiver

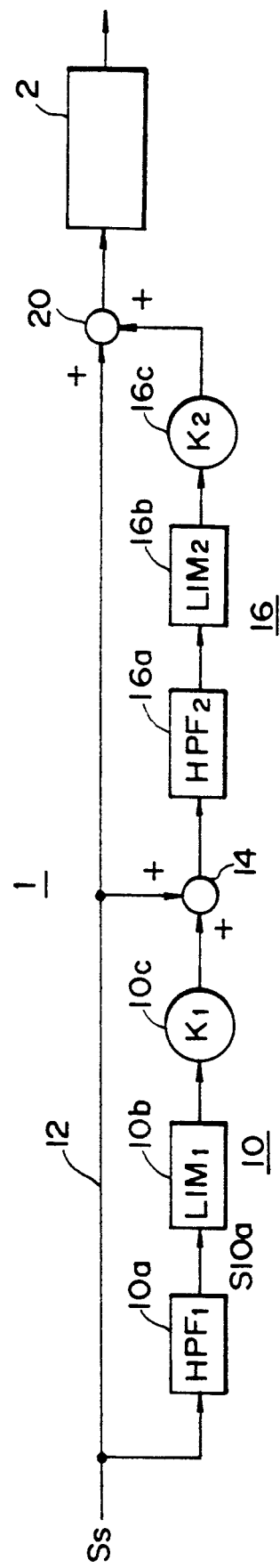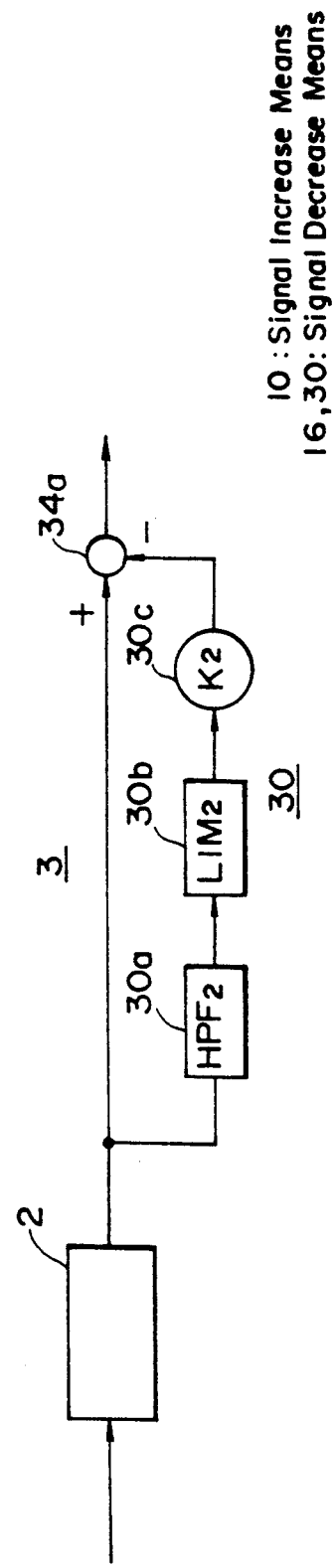
FIG. 3(a)
FIG. 3(b)
10: Signal Increase Means
16, 30: Signal Decrease Means

NONLINEAR PREEMPHASIS-DEEMPHASIS SYSTEM

BACKGROUND OF THE INVENTION

1. Field of the Invention

The present invention relates to a preemphasis circuit and a complementary deemphasis circuit for use in a recording/playback apparatus such as a video or audio tape recorder, or in communication equipment.

In recording apparatus as well as in communication equipment, preemphasis is executed on the recording or transmitting side and deemphasis on the playback or receiving side to enhance the signal-to-noise ratio. If, in a preemphasis circuit, which increases the amplitude of a signal component whose frequency is higher than a predetermined frequency, a circuit with a limiter is used, the preemphasis circuit is termed a nonlinear preemphasizer and the signal amplitude to be increased is limited to a predetermined threshold level. The present invention more particularly relates to a system comprising such a nonlinear preemphasis circuit and a complementary nonlinear deemphasis circuit for improving the distortion characteristic normally attributed to nonlinearity.

2. Description of the Prior Art

FIG. 8 is a block diagram of a conventional system consisting of a nonlinear preemphasis circuit and a nonlinear deemphasis circuit. In a video tape recorder as an example, a recording section 1a includes a high-pass filter 52, a limiter 54, a signal increaser (also referred to as a coefficient multiplier) 56 and an adder 58. The high-pass filter 52 passes frequencies above a predetermined high frequency component of an input signal $S_s$, and the limiter 54 limits the amplitude of the signal component passed through the high-pass filter 52 to a predetermined threshold level, as graphically shown in FIG. 10. The signal increaser 56 serves to increase the output signal level of the limiter 54 in accordance with the frequency of that signal. Such nonlinear preemphasis circuit 50 prevents, via the limiter 54, further amplification of the output of the high-pass filter 52 beyond the predetermined threshold level. The signal component whose frequency is higher than the predetermined frequency and whose level has been increased by signal increaser 56 is supplied to the adder 58 whereat it is added to the input signal $S_s$. The summed signal thus obtained is supplied as a recording signal to a recording/playback section 2a, where the signal is recorded on a magnetic tape and subsequently read out therefrom to be reproduced in a playback section 3a. In this example, the recording/playback section 2a comprises a recording head, a magnetic tape, a playback head and an amplifier.

The playback section 3a includes a nonlinear deemphasis circuit 70 which comprises a subtracter 78, a high-pass filter 72, a limiter 74 and a coefficient multiplier 76 which operate to decrease the amplitude of a signal component in a manner that is complementary to the increase obtained in the recording section 1a. The deemphasis circuit 70 is an inverted version of the nonlinear preemphasis circuit 50.

The circuits in the playback section 3a of FIG. 8 are arranged in a negative feedback loop and exhibit very good deemphasis characteristics. However, due to the negative feedback circuit configuration, high stability is not achievable over a wide frequency range. Furthermore, this circuit configuration is not readily suited to be implemented in an IC configuration.

FIG. 9 shows an improvement of the nonlinear deemphasis circuit of FIG. 8. To solve the problem attributed to the negative feedback circuit configuration in the example of FIG. 8, a nonlinear deemphasis circuit 80 is comprised of a high-pass filter 82, a limiter 84 and a coefficient multiplier 86 which are connected in feedforward configuration to an adder 88. The nonlinear deemphasis circuit formed of high-pass filter 82, limiter 84 and coefficient multiplier 86 is designed to have an operating characteristic that is the inverse to that of the nonlinear preemphasis circuit 50.

The nonlinear deemphasis circuit 80 of FIG. 9 has a flat frequency characteristic with small distortion in the lower frequency range where the amplitude of the preemphasized/deemphasized signal is not limited by the limiters 54 and 84 (this is referred to as the linear area of operation of the preemphasis or deemphasis circuit). However, distortion occurs in the nonlinear area where the signal amplitude is widely limited by the limiters.

FIG. 11 shows the configuration of another nonlinear deemphasis circuit that is intended to solve the above problem of distortion in the nonlinear area of operation. The nonlinear deemphasis circuit 90 in FIG. 11 consists of a parallel connection of two nonlinear deemphasis circuits 90a and 90b which operate on mutually different frequency components. In this example, a signal component in one frequency band passes through a high-pass filter 91 and a low-pass filter 93 in the first deemphasis circuit 90a and then its amplitude is decreased by a coefficient multiplier 94. A signal component in another frequency band passes through a high-pass filter 95 and a low-pass filter 97 in the second deemphasis circuit 90b and then its amplitude is decreased by a coefficient multiplier 98. The two amplitude-decreased signal components in these mutually different frequency bands are combined in an adder 68.

The nonlinear deemphasis circuit 90 shown in FIG. 11 has a feedforward configuration and thus exhibits improved distortion characteristics. However, its circuit configuration is undesirably complicated.

OBJECT AND SUMMARY OF THE INVENTION

It is an object of the present invention to provide an improved nonlinear preemphasis-deemphasis system comprised of a nonlinear preemphasis circuit and a nonlinear deemphasis circuit of simplified circuit configuration which exhibits reduced distortion due to the use of limiters that are provided for nonlinear preemphasis and deemphasis.

Differing from the conventional method which improves the distortion characteristic of the deemphasis circuit in a playback (receiving) section, the present invention is based on a simplified circuit configuration of a feedforward deemphasis circuit in the playback section, wherein the expected distortion component attributed to the feedforward configuration is added to the preemphasized signal in the recording (transmitting) section to consequently achieve overall reduction of the distortion in the entire preemphasis-deemphasis system.

According to one aspect of the present invention, there is provided a nonlinear preemphasis-deemphasis system consisting of nonlinear preemphasis and deemphasis circuits. The preemphasis circuit comprises a nonlinear signal increase circuit for increasing the amplitude of an input signal component whose frequency is higher than a predetermined frequency, in accordance with the frequency of that component until the signal component reaches a predetermined threshold level, a first adder for adding the output of the nonlinear signal increase circuit to the input signal, a signal decrease circuit having an operating characteristic inverse to that of the nonlinear signal increase circuit, and a second adder for adding the output of the signal decrease circuit to the input signal. The deemphasis circuit is connected via a signal transfer device to the nonlinear preemphasis circuit which comprises a nonlinear signal decrease circuit having an operating characteristic inverse to that of the nonlinear signal increase circuit in the preemphasis circuit, to decrease the amplitude of the received signal component whose frequency is higher than the predetermined frequency, until the received component reaches a predetermined threshold level, and a subtracter for subtracting the output of this signal decrease circuit from the received signal.

Since the nonlinear signal decrease circuit of the deemphasis circuit has an operating characteristic inverse to that of the nonlinear signal increase circuit in the preemphasis circuit and is connected in a feedforward circuit configuration, the stability problem found in the negative feedback circuit configuration is obviated.

In the nonlinear preemphasis circuit, the first adder and the signal decrease circuit calculate and add a correction signal to the input signal. This correction signal is used for correcting nonlinear distortion that may be caused when the amplitude of the higher frequency signal component being increased is limited to a predetermined threshold level by the limiter in the nonlinear signal increase circuit. Since the added correction signal component is transferred to the signal receiving section, distortion is corrected there despite the use of the limiter in the deemphasis circuit to limit the amplitude of the higher frequency component of the received signal. Consequently, an undistorted playback signal is obtained in the signal receiving section.

The above and other features and advantages of the present invention will become apparent from the following description which will be given with reference to the illustrative accompanying drawings.

BRIEF DESCRIPTION OF THE DRAWINGS

FIGS. 3A and 3B comprise a more detailed block diagram of a nonlinear preemphasis circuit and a nonlinear deemphasis circuit in accordance with the present invention;

DESCRIPTION OF THE PREFERRED EMBODIMENT

Figure 1A:
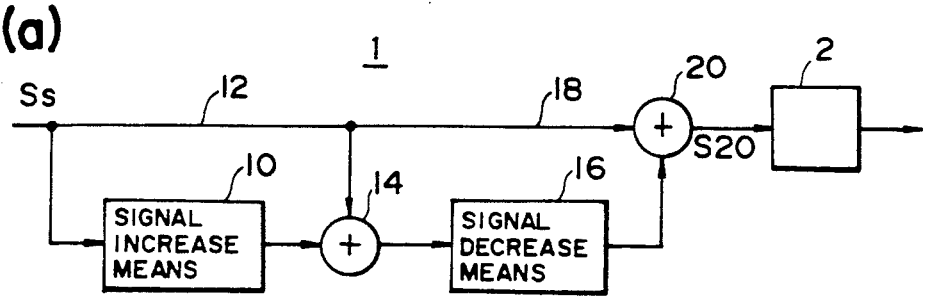
FIGS. 1A and 1B comprise a block diagram of a nonlinear preemphasis-deemphasis system embodying the present invention.

Referring now to FIGS. 1 and 3, a block diagram of a nonlinear preemphasis-deemphasis system in accordance with the present invention is illustrated as comprising a nonlinear preemphasis circuit and a nonlinear deemphasis circuit in the environment of, for example, a video tape recorder. The nonlinear preemphasis circuit is provided in a recording section 1, and the nonlinear deemphasis circuit is provided in a playback section 3 connected via a recording/playback section 2.

A signal increase circuit 10 in the nonlinear preemphasis circuit includes a first high-pass filter 10a, a first limiter 10b and a coefficient multiplier 10c (FIG. 3A). The first limiter 10b and the coefficient multiplier 10c may be connected in reverse order.

Figure 4:
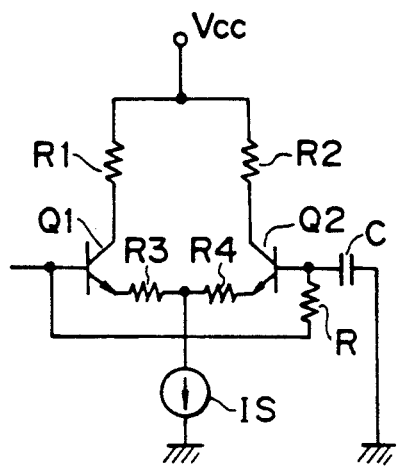
FIG. 4 is a schematic diagram of one embodiment of a high-pass filter and coefficient multiplier that may be used in the embodiment of FIG. 3.

FIG. 4 shows an illustrative analog circuit configuration of high-pass filter 10a and coefficient multiplier 10c. In the example of FIG. 4, a low-pass filter formed of a resistor R and a capacitor C is connected to a circuit comprised of differentially connected transistors Q1 and Q2, resistors R1–R4 and a current source IS. When an input signal is applied to the base of the transistor Q1, an amplitude increasing signal determined by the amplification factor of the transistor, and corresponding to the amplification coefficient k1 of the coefficient multiplier 10c, is provided as the output from the collector of the transistor Q2.

Figure 5:
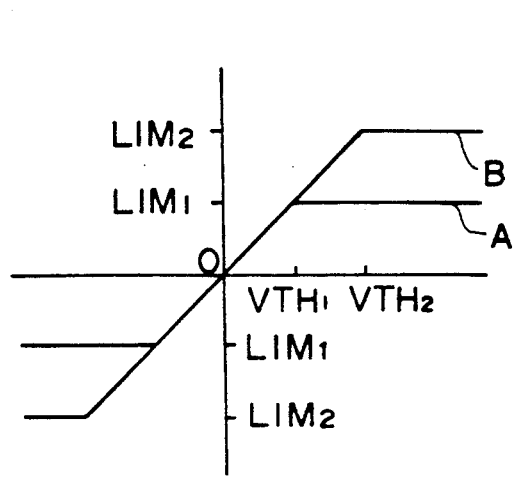
FIG. 5 graphically shows the characteristics of limiters employed in the embodiment of FIG. 3.

FIG. 5 graphically shows the limiting characteristic of the first limiter 10b which serves to limit the signal voltage once it reaches its threshold voltage $V_{TH1}$. The limiting characteristic A is symmetrical with respect to the origin point 0.

As shown in FIG. 3A, a signal decrease circuit 16 in the nonlinear preemphasis circuit includes a high-pass filter 16a, a limiter 16b and a coefficient multiplier 16c. The limiter 16b and the coefficient multiplier 16c may be connected in reverse order. The nonlinear signal decreasing characteristic of the signal decrease circuit 16 is selected to be the inverse of the operating characteristic of the nonlinear signal increase circuit 10. The high-pass filter 16a and the coefficient multiplier 16c are similar to the circuit configuration shown in FIG. 4. However, transistors Q1 and Q2 which form the coefficient multiplier 16c serve to decrease or attenuate the signal supplied thereto by a second coefficient k2 as opposed to amplifying the signal. FIG. 5 shows the characteristic B of the second limiter 16b which serves to limit the signal voltage if it is equal to or greater than the threshold voltage $V_{TH2}$.

Figure 6:
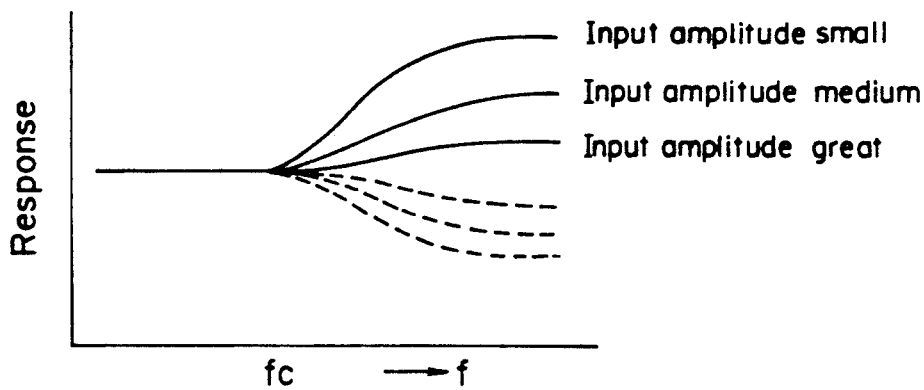
FIG. 6 graphically shows the operating characteristics of the nonlinear preemphasis circuit and the nonlinear deemphasis circuit of the embodiment shown in FIG. 3.

As shown in FIGS. 1A and 3A, a first adder 14 adds the output of the nonlinear signal increase circuit 10 to the input signal $S_s$ supplied to the preemphasis circuit, and a second adder 20 adds the output of the signal decrease circuit 16 to the input signal $S_s$. The nonlinear preemphasis characteristic of the described nonlinear preemphasis circuit is represented by solid lines in FIG. 6, and the deemphasis characteristic of the nonlinear deemphasis circuit (to be described) is represented by broken lines.

The output of the second adder 20 is recorded on a magnetic tape via a recording head (not shown).

Since the nonlinear preemphasis circuit of FIG. 3A is formed by the mere addition to a conventional preemphasis circuit of the signal decrease circuit 16 and the second adder 20, the circuit configuration of the preemphasis circuit is seen to be relatively simple.

Figure 1B:
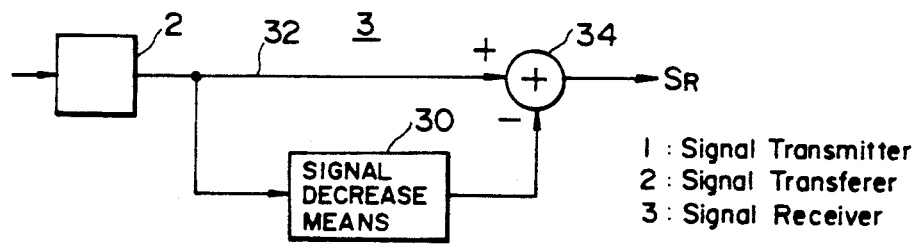
Figure 2:
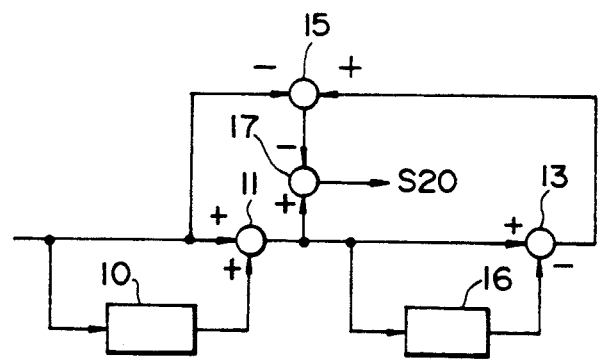
FIG. 2 is an equivalent block diagram of a nonlinear preemphasis circuit used in the system of FIG. 1.

The nonlinear deemphasis circuit of FIG. 3B includes a nonlinear signal decrease circuit 30 comprising a still further high-pass filter 30a, another limiter 30b, an additional coefficient multiplier 30c, and a signal subtracter 34a. The nonlinear deemphasis circuit 30 is similar in circuit configuration to the signal decrease circuit 16 together with the second adder 20 of the feedforward nonlinear preemphasis circuit. A playback signal $S_R$ is obtained via such nonlinear deemphasis circuit, as shown in FIG. 1B.

Now a description is provided of an illustrative digital circuit configuration of the nonlinear preemphasis circuit of the present invention which may be used in a digital communication system.

Figure 7:
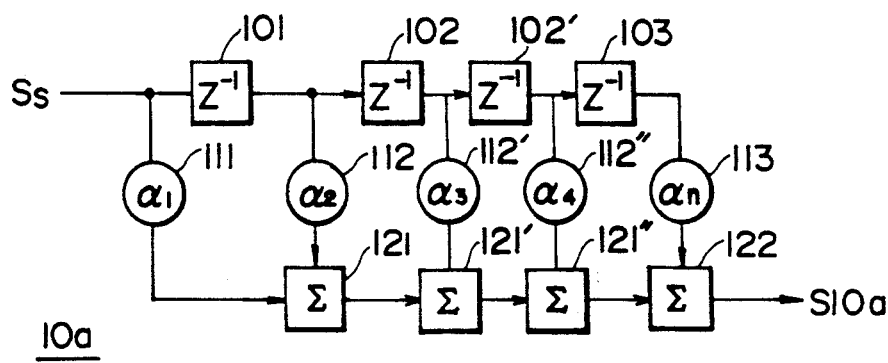
FIG. 7 illustrates one embodiment of a digital implementation of the high-pass filter and coefficient multiplier that may be used in the embodiment of FIG. 3.
Figure 8:
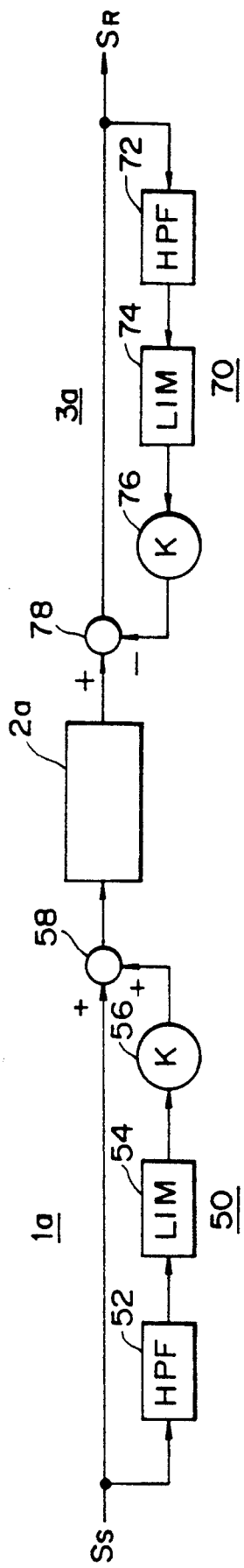
FIGS. 8 and 9 are block diagrams of conventional nonlinear preemphasis-deemphasis systems.
Figure 9:
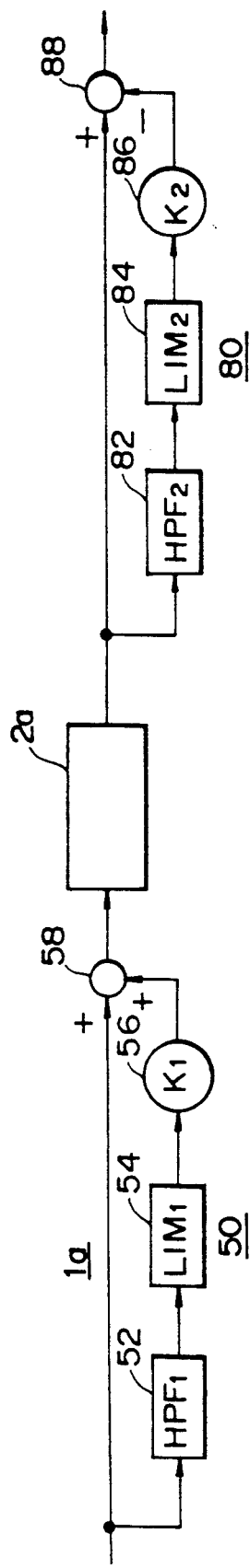
Figure 10:
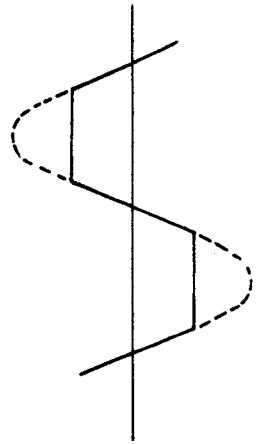
FIG. 10 graphically shows how the limiters of FIGS. 8 and 9 serve to limit the signal amplitude.
Figure 11:
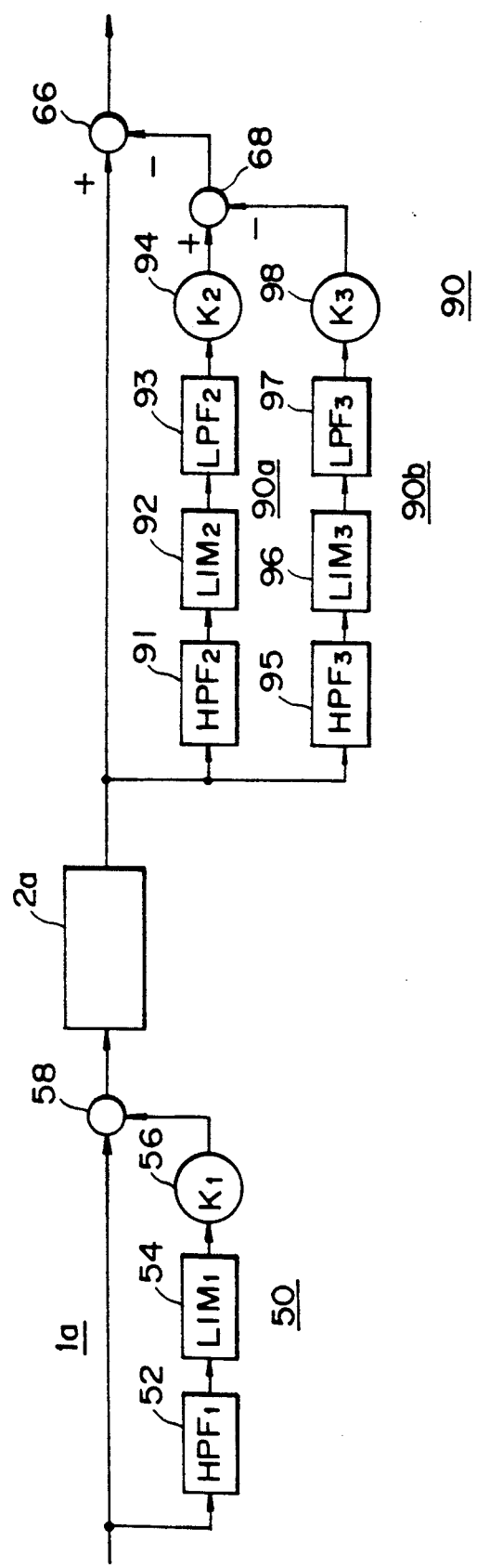
FIG. 11 is a block diagram of another conventional nonlinear preemphasis-deemphasis system.

The high-pass filter 10a and the coefficient multiplier 10c shown in FIG. 3A are comprised of a plurality of series-connected stages, e.g. five stages, of transversal filters the first stage comprising, as shown in FIG. 7, a coefficient multiplier 111, the second stage comprising a unitary delay element 101, a coefficient multiplier 112, and an adder 121, the third stage comprising a unitary delay element 102, a coefficient multiplier 112' and an adder 121', the fourth stage comprising a unitary delay element 102', a coefficient multiplier 112" and an adder 121" and the fifth stage comprising a unitary delay element 103, a coefficient multiplier 113 and an adder 122. The respective coefficients $a1-an$ of each transversal filter stage determines the pass frequency of the high-pass filter and the first coefficient k1. The digital implementation of limiter 10b has the characteristic shown in FIG. 5 and is similar to the aforementioned characteristic A.

The digital implementation of the high-pass filter 16a and the coefficient multiplier 16c of the signal decrease circuit shown in FIG. 3A are also similar to the circuit configuration of FIG. 7. However, here the coefficients $a1-an$ are different from the coefficients which determine the high-pass filter 10a and the coefficient multiplier 10c.

The nonlinear signal decrease circuit 30 is similar in digital circuit configuration to the aforementioned digital construction of the signal decrease circuit 16.

In constructing the nonlinear preemphasis and deemphasis circuits of the present invention, a variety of modifications may be contemplated in addition to the embodiment described above. For example, in place of an analog circuit or a digital integrated circuit, a DSP (digital signal processor) or the like may be used to form the entirety or each of the aforementioned nonlinear signal increase circuit 10, adder 14, signal decrease circuit 16 and adder 20 in the nonlinear preemphasis unit. Similarly, such digital signal processor may be used to implement the nonlinear deemphasis circuit as well.

In accordance with the nonlinear preemphasis system of the present invention, as described hereinabove, a distortion-corrected playback signal is obtained over a wide frequency band using a simplified circuit configuration in the playback (receiving) section. Further, by using the nonlinear deemphasis circuit of the present invention, stable operation is ensured for the whole system because of the feedforward circuit configuration.

What is claimed is:

1. A nonlinear preemphasis circuit comprising:
   nonlinear signal increase means for increasing the amplitude of an input signal component, whose frequency is higher than a predetermined frequency, in accordance with the frequency of said signal component, until said signal component reaches a predetermined threshold level, thereby producing a nonlinear increasing output;
   first adder means for adding said nonlinear increasing output to the input signal to produce an adder output;
   nonlinear signal decrease mans coupled to said first adder means to receive said adder output and for decreasing the amplitude of a signal component of said adder output whose frequency is higher than said predetermined frequency in accordance with the frequency of said signal component and inversely to the amplitude increase by said nonlinear signal increase means, thereby producing a nonlinear decreasing output; and
   second adder means for adding said nonlinear decreasing output to the input signal.

2. A nonlinear preemphasis-deemphasis system comprising:
   a nonlinear preemphasis circuit comprising nonlinear signal increase means having a nonlinear operating characteristic for increasing the amplitude of an input signal component, whose frequency is higher than a predetermined frequency, in accordance with the frequency of said signal component until said signal component reaches a predetermined threshold level, thereby producing a nonlinear increasing output, first adder means for adding said nonlinear increasing output to the input signal to produce an adder output, nonlinear signal decrease means having a nonlinear operating characteristic inverse to the nonlinear operating characteristic of said nonlinear signal increase means and coupled to said first adder means to receive said adder output and produce therefrom a nonlinear decreasing output, and second adder means for adding said nonlinear decreasing output to the input signal to produce a preemphasized signal; and
   a nonlinear deemphasis circuit complementary to said nonlinear preemphasis circuit and connected thereto via signal transfer means to receive the preemphasized signal, said deemphasis circuit comprising second nonlinear signal decrease means for decreasing the amplitude of a received signal component, whose frequency is higher than said predetermined frequency, in accordance with the frequency of said signal component until said signal component reaches a predetermined threshold level, and subtracter means for subtracting the output of said second nonlinear signal decrease means from the received signal.

3. A nonlinear preemphasis-deemphasis system according to claim 2, wherein said second nonlinear signal decrease means has a nonlinear operating characteristic inverse to the operating characteristic of said nonlinear signal increase means.

4. The nonlinear preemphasis circuit of claim 1 wherein said nonlinear signal increase means comprises a cascade connection of high pass filter means for passing signal components of frequencies greater than said predetermined frequency, limiter means for amplitude-limiting the signal components passed by said high pass filter means to no more than said predetermined threshold level, and coefficient multiplier means for increasing the amplitude of the signal components passed by said high pass filter means.

5. The nonlinear preemphasis circuit of claim 4 wherein said nonlinear signal decrease means comprises a second cascade connection of second high pass filter means for passing signal components of frequencies greater than said predetermined frequency, second limiter means for amplitude-limiting the signal components passed by said second high pass filter means to no more than a predetermined threshold level, and second coefficient multiplier means for decreasing the amplitude of the signal components passed by said second high pass filter means.

6. The nonlinear preemphasis circuit of claim 5 wherein the high pass filter means and coefficient multiplier means of said nonlinear signal increase means, and the high pass filter means and coefficient multiplier means of said nonlinear signal decrease mans each comprises a pair of differentially-connected transistors having a respective amplification factor, and a low pass filter coupled to an input of one of said transistors for supplying said signal components thereto.

* * * * *